United States Patent
Kubota

(10) Patent No.: US 9,396,968 B2
(45) Date of Patent: Jul. 19, 2016

(54) ETCHING METHOD AND ETCHING APPARATUS

(71) Applicant: Tokyo Electron Limited, Tokyo (JP)

(72) Inventor: Kazuhiro Kubota, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/402,780

(22) PCT Filed: Jun. 24, 2013

(86) PCT No.: PCT/JP2013/067288
§ 371 (c)(1),
(2) Date: Nov. 21, 2014

(87) PCT Pub. No.: WO2014/002965
PCT Pub. Date: Jan. 3, 2014

(65) Prior Publication Data
US 2015/0140821 A1 May 21, 2015

Related U.S. Application Data

(60) Provisional application No. 61/667,527, filed on Jul. 3, 2012.

(30) Foreign Application Priority Data

Jun. 25, 2012 (JP) .................................. 2012-141660

(51) Int. Cl.
| | |
|---|---|
| *H01L 21/4757* | (2006.01) |
| *H01L 21/311* | (2006.01) |
| *H01J 37/32* | (2006.01) |
| *H01L 21/02* | (2006.01) |
| *H01L 21/67* | (2006.01) |
| *H01L 21/768* | (2006.01) |

(52) U.S. Cl.
CPC ...... *H01L 21/47573* (2013.01); *H01J 37/32431* (2013.01); *H01L 21/0262* (2013.01); *H01L 21/31116* (2013.01); *H01L 21/31144* (2013.01); *H01L 21/67069* (2013.01); *H01L 21/76802* (2013.01); *H01J 37/32091* (2013.01); *H01J 2237/334* (2013.01)

(58) Field of Classification Search
CPC ............... H01L 21/47573; H01L 21/0262; H01L 21/31116; H01L 21/31144; H01L 21/67069; H01L 21/76802; H01L 37/32431
See application file for complete search history.

(56) References Cited

U.S. PATENT DOCUMENTS

| | | | | |
|---|---|---|---|---|
| 6,297,163 B1 * | 10/2001 | Zhu | ................... | H01L 21/31116 257/E21.252 |
| 2003/0040192 A1 * | 2/2003 | Kanegae | ........... | H01L 21/31138 438/710 |

FOREIGN PATENT DOCUMENTS

| | | |
|---|---|---|
| JP | H11-307516 | 11/1999 |
| JP | 2003-133293 | 5/2003 |
| JP | 2004-063512 | 2/2004 |

\* cited by examiner

*Primary Examiner* — Duy Deo
(74) *Attorney, Agent, or Firm* — IPUSA, PLLC

(57) ABSTRACT

An etching method is provided that includes the steps of supplying an etching gas containing a fluorocarbon (CF) based gas into a processing chamber, generating a plasma from the etching gas, and etching a silicon oxide film through a polysilicon mask using the plasma. The polysilicon film has a predetermined pattern and is arranged on the silicon oxide film. The silicon oxide film has at least one of a silicon content per unit volume, a fluorine content per unit volume, and a volume density that varies in a depth direction.

10 Claims, 13 Drawing Sheets

FIG.1B
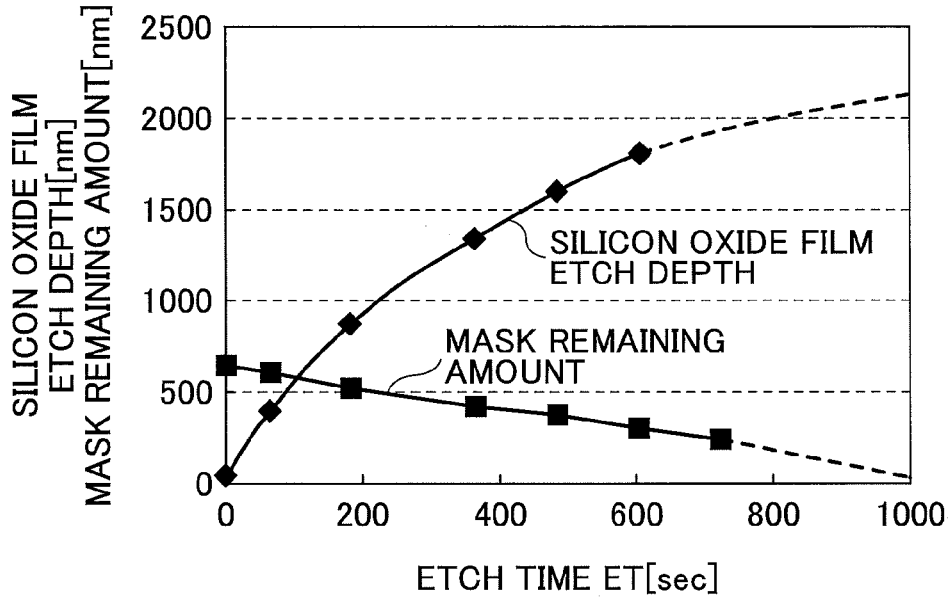
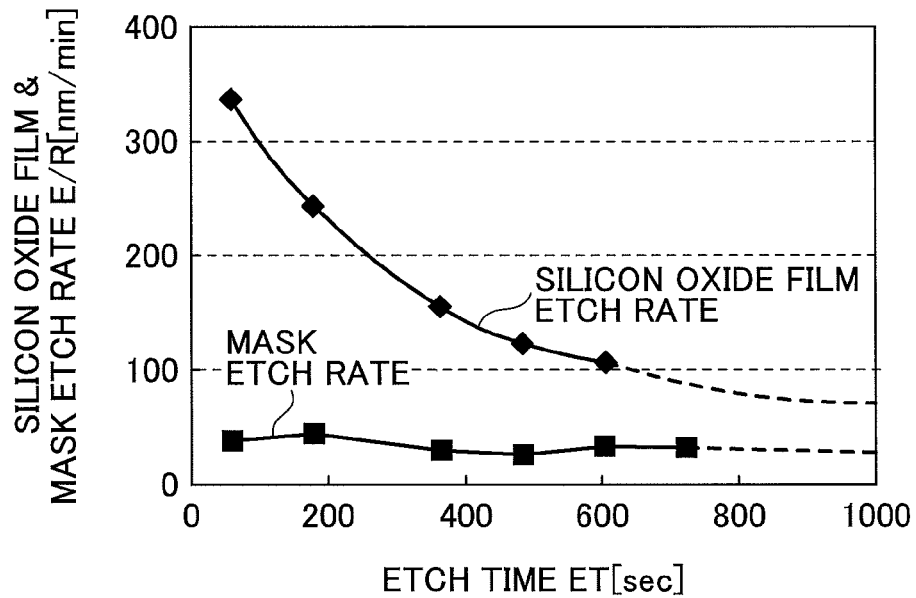

ETCHING METHOD AND ETCHING APPARATUS

The present application is based on and claims the benefit of priority of Japanese Patent Application No. 2012-141660 filed on Jun. 25, 2012 and U.S. Provisional Application No. 61/667,527 filed on Jul. 3, 2012, the entire contents of which are herein incorporated by reference.

TECHNICAL FIELD

The present invention relates to an etching method and an etching apparatus.

BACKGROUND ART

In etching contact holes having a high aspect ratio, an etch stop may occur at a higher probability as the depth of the hole bottom increases. As a method of preventing an etch stop, for example, Patent Document 1 discloses a method that involves increasing the pressure within a processing chamber according to the etching progress. According to this method, the difference between the pressure within the chamber and the pressure within the holes being formed is reduced as much as possible at each depth.

PRIOR ART DOCUMENTS

Patent Documents

Patent Document 1: Japanese Laid-Open Patent Publication No. 2004-063512

SUMMARY OF THE INVENTION

Problem to be Solved by the Invention

However, in Patent Document 1, the insulating film of a workpiece in which the contact holes are formed is made of the same material throughout the depth of the holes. Thus, even if the pressure within the chamber is increased in accordance with the etching progress to reduce the pressure differences, it becomes increasingly difficult to reduce the pressure differences as the depth of the contact holes is increased. As a result, an etch stop may inevitably occur. Also, when process conditions such as the pressure are changed, an etching state of a mask may also be changed. For example, the mask may be deformed or bowing may occur at the contact holes, and as a result, the shape of the contact holes may be degraded.

In light of the above, an aspect of the present invention relates to providing an etching method and an etching apparatus that are capable of preventing the occurrence of an etch stop and etching a workpiece into a desirable shape.

Means for Solving the Problem

According to one embodiment of the present invention, an etching method is provided that includes the steps of supplying an etching gas containing a fluorocarbon (CF) based gas into a processing chamber and generating a plasma from the etching gas, and etching a silicon oxide film through a polysilicon mask using the plasma. The polysilicon film has a predetermined pattern and is arranged on the silicon oxide film. The silicon oxide film has at least one of a silicon content per unit volume, a fluorine content per unit volume, and a volume density that varies in a depth direction.

According to another embodiment of the present invention, an etching apparatus is provided that includes a processing chamber and a gas supply source. The processing chamber accommodates a workpiece including a silicon oxide film and a polysilicon mask, which has a predetermined pattern and is arranged on the silicon oxide film. The silicon oxide film has at least one of a silicon content per unit volume, a fluorine content per unit volume, and a volume density that varies in a depth direction. The gas supply source supplies an etching gas containing a fluorocarbon (CF) based gas into the processing chamber. The silicon oxide film is etched by a plasma generated from the etching gas through the polysilicon mask having the predetermined pattern.

Advantageous Effect of the Invention

According to an aspect of the present invention, etch stop may be prevented and a workpiece may be etched into a desirable shape.

BRIEF DESCRIPTION OF THE DRAWINGS

FIG. 1B illustrates the etch depth and the etch rate in relation to the etch time;

EMBODIMENTS FOR IMPLEMENTING THE INVENTION

Figure 1A:
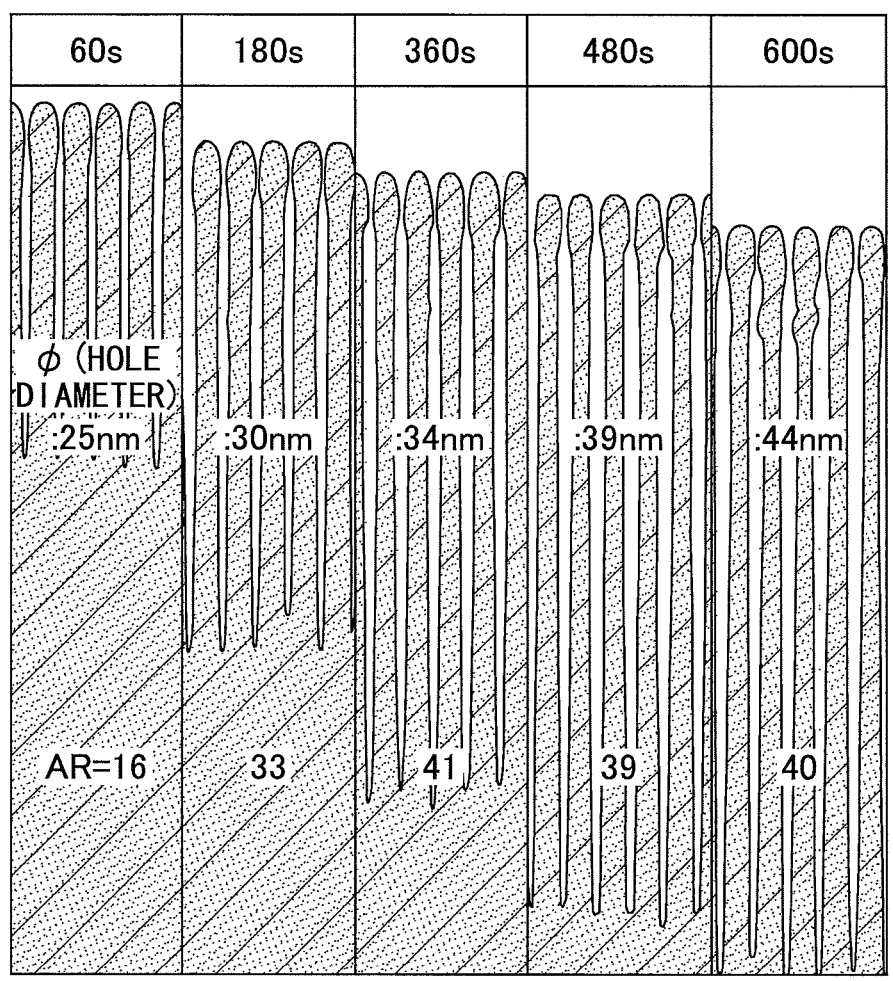
FIG. 1A is a cross-sectional view of hole shapes according to the etch time.

In the following, embodiments of the present invention are described with reference to the accompanying drawings. Note that elements having substantially the same functions or features may be given the same reference numerals and overlapping descriptions thereof may be omitted.

[Introduction]

Figure 2A:
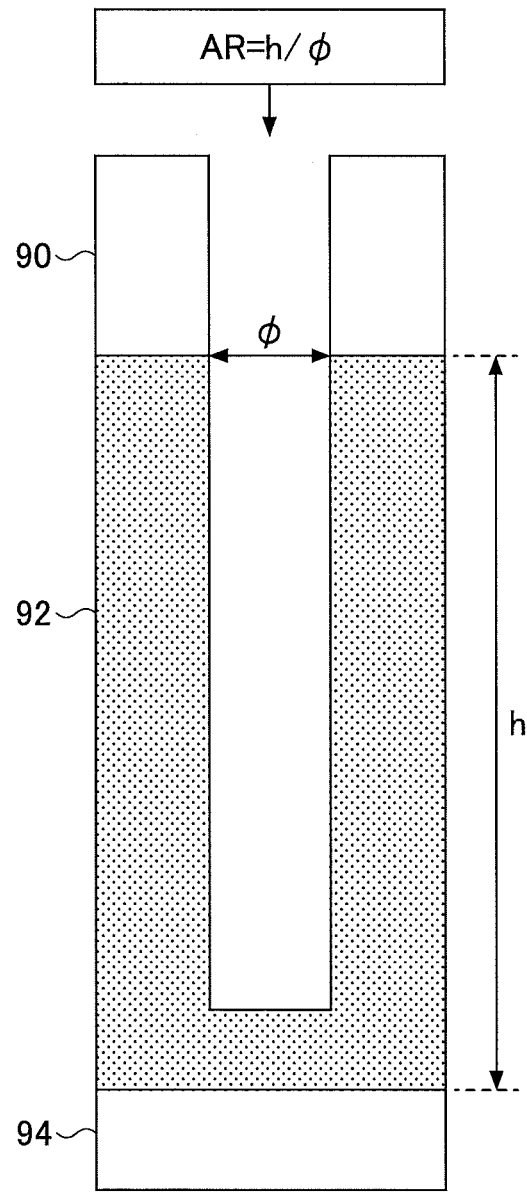
FIG. 2A is a longitudinal cross-sectional view of a film arranged on a silicon wafer.
Figure 2B:
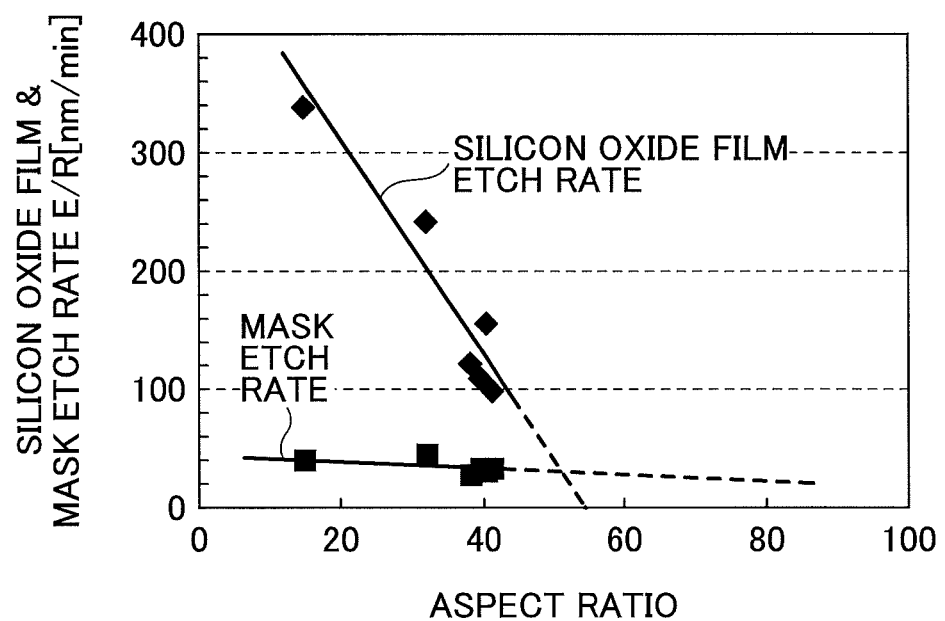
FIG. 2B illustrates a relationship between the etch rate and the aspect ratio.
Figure 3:
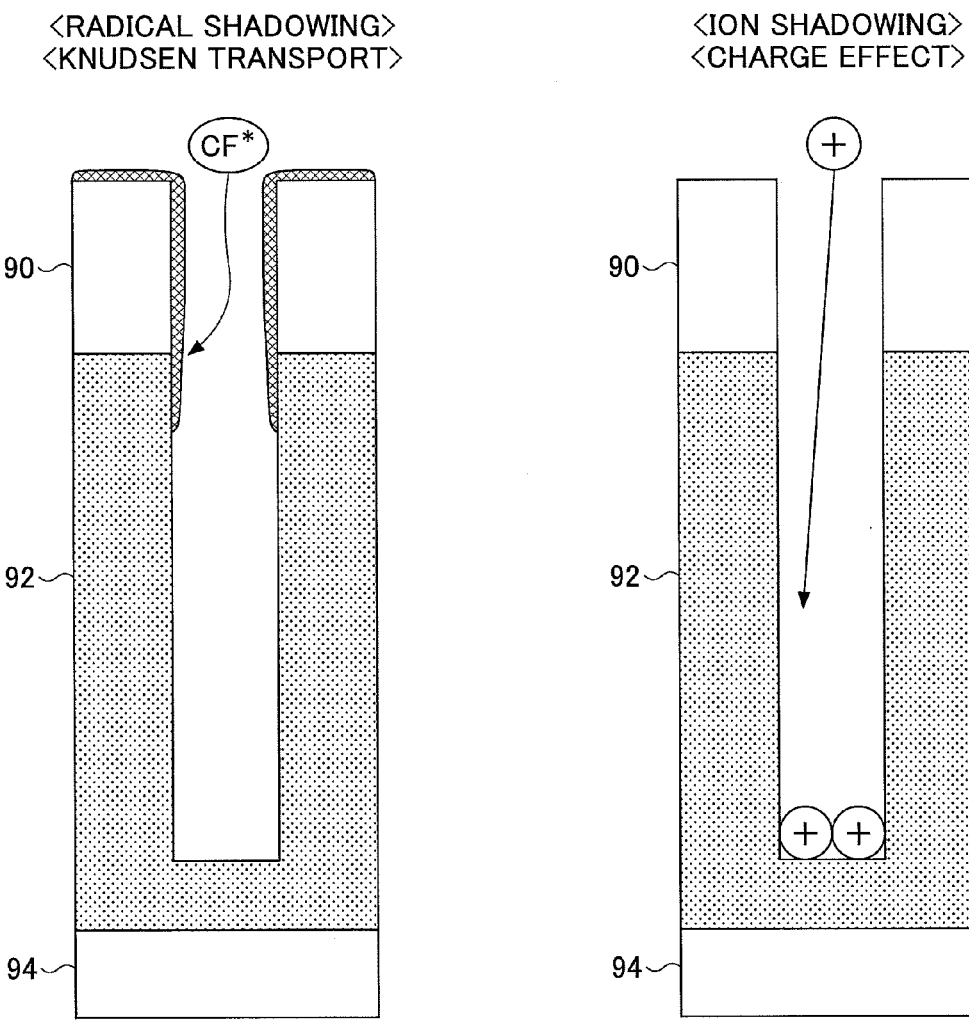
FIG. 3 illustrates physical phenomena that occur upon etching a hole.

In etching a contact hole (hole) having a high aspect ratio, the etch rate tends to decrease as the depth of the hole bottom increases. Such a phenomenon is described below with reference to FIGS. 1A, 1B, 2A, 2B, and 3. FIG. 1A is a cross-sectional view of hole shapes according to the etch time. FIG. 1B illustrates the etch rate and the etch depth of the hole in relation to the etch time. FIG. 2A is a longitudinal cross-sectional view of a film arranged on a silicon wafer. FIG. 2B illustrates a relationship between the etch rate and the aspect ratio of the hole. FIG. 3 illustrates physical phenomena that occur upon etching of the contact hole.

The required aspect ratio (AR) of a contact hole has typically been around 50. As illustrated in FIG. 2A, the aspect ratio (AR) is represented by the ratio of the depth h of the hole to the diameter φ of the hole opening (diameter at the top of the hole in the illustrated example). Thus, when the hole depth h is 2 μm and the hole diameter φ is 40 nm, the aspect ratio is 50.

In recent years, with the development of microfabrication technology, there has been a growing demand for holes having a diameter φ of about 20 nm. In terms of the aspect ratio (AR), for example, holes having an aspect ratio of about 100 are now in demand.

Also, in etching a deep hole with a small diameter, the etch rate tends to decrease as the depth of the hole to be etched increases. The etch rate corresponds to an amount that can be etched per unit time. For example, the etch rate may be represented by the etch amount per minute (nm/min).

For example, FIG. 1A illustrates a cross-sectional view of hole shapes according to the etch time upon etching holes in a silicon oxide ($SiO_2$) film. In this experiment, a lower side dual frequency type parallel plate etching apparatus that performs parallel plate plasma etching (e.g. FIG. 8) is used as an example. The etching process conditions are as follows: pressure 2.66 Pa, frequency 40 MHz and power density 1.18 (W/cm$^2$) for plasma generation high frequency power HF (High Frequency), frequency 3.2 MHz and power density 4.42 (W/cm$^2$) for ion attraction high frequency power LF (Low Frequency), and gas mixture of $C_4F_6/C_4F_8/Ar/O_2$ as the processing gas. The silicon oxide film is etched under the above process conditions using a polysilicon mask. FIG. 1A illustrates the cross-sectional shapes of the holes, the hole diameters φ, and the aspect ratios AR at etch times of 60 seconds, 180 seconds, 360 seconds, 480 seconds, and 600 seconds. According to the experimental results, as the etch depth h increases, the hole diameter φ increases and the aspect ratio AR increases.

FIG. 1B [a] is a graph having a horizontal axis representing the etch time ET and a vertical axis representing the etch depth. FIG. 1B [a] illustrates the relationship between the etch time ET and the depth h of the holes etched in the silicon oxide film and the remaining amount of the polysilicon mask, which has a predetermined etch pattern formed thereon and is used for etching the silicon oxide film. FIG. 1B [b] is a graph having a horizontal axis representing the etch time ET and a vertical axis representing the etch rate E/R. FIG. 1B [b] illustrates the etch rate of the silicon oxide film and the etch rate of the mask relative to the etch time ET.

It can be appreciated from the graphs [a] and [b] of FIG. 1B that as the etch time ET becomes longer and the etched hole becomes deeper, the etch rate of the silicon oxide film decreases and it becomes increasingly difficult to etch the hole bottom. Also, it can be appreciated that the etch rate of the mask is more or less constant irrespective of the etch time ET, and the decrease rate of the polysilicon mask is more or less constant.

Based on the above, when an etching process is performed on a silicon oxide film having the same film properties throughout the depth direction, an etch stop ultimately occurs. Also, when process conditions such as the pressure is changed in order to increase the etch rate, the device shape may be degraded.

FIG. 2B is a graph illustrating the etch rate of a silicon oxide film and the etch rate of a mask in relation to the aspect ratio (horizontal axis) in an exemplary case of etching a silicon oxide ($SiO_2$) film 92 that is arranged on a silicon wafer 94 using a polysilicon mask 90 (see FIG. 3). As illustrated in FIG. 2B, the etch rate of the silicon oxide ($SiO_2$) film 92 that is arranged on the silicon wafer 94 is proportional to the aspect ratio (the etch rate of the silicon oxide film 92 depends on the aspect ratio). It can be appreciated from this result that as the etch time of FIG. 1A progresses and the aspect ratio increases, the etch rate of the silicon oxide film 92 decreases.

Also, it can be predicted based on the graph of FIG. 2B that an etch stop will occur at the hole bottom when the aspect ratio of the etched hole increases to approximately 55. Note that because the polysilicon mask 90 is formed above the hole formed in the silicon oxide film 92, the etch rate of the polysilicon mask 90 does not depend on the aspect ratio.

In the following, a reason why the etch rate decreases as the hole becomes deeper is explained with reference to FIG. 3. FIG. 3 schematically illustrates physical phenomena of CF* radicals and ions in a case where deep holes are formed using a fluorocarbon (CF) based gas as an etching gas.

Physical phenomena of radicals include radical shadowing and Knudsen transport of radicals, which are each described below. In a vacuum, only CF* radicals (fluorocarbon radicals) in plasma that are at a predetermined angle of incidence enter an etched hole (see left side drawing of FIG. 3). CF* radicals at angles greater than the predetermined angle cannot enter the hole. The predetermined angle is determined by the depth of the hole. As the depth of the hole increases, the angle of the CF* radicals that can reach the bottom of the hole becomes more limited, and the number of CF* radicals that reach the hole bottom decreases. Such a phenomenon is referred to as radical shadowing.

Also, a large portion of the CF* radicals that have entered the hole collide with the wall surface of the hole. Such CF* radicals either stick to the wall surface or bounce back to proceed deeper into the hole. The Knudsen transport determines the probability of the colliding gas particles remaining stuck to the wall surface of the hole and the probability of the gas particles bouncing back from the wall surface and proceeding toward the hole bottom to reach the hole bottom based on an attraction coefficient.

Similarly, only ions in plasma that are at a predetermined angle of incidence enter the hole (see right side drawing of FIG. 3). Ions at angles greater than the predetermined angle cannot enter the hole. The predetermined angle is determined by the depth of the hole. As the hole becomes deeper, the predetermined angle of the ions that can enter the hole becomes more limited, and the number of ions that can reach the hole bottom decreases. Such a phenomenon is referred to as ion shadowing.

Ions have positive charges. Thus, when the positive charges are accumulated at the bottom of the hole, they react against ions that enter the hole. As a result, the entering ions are rebound from the bottom of the hole. Such a phenomenon is referred to as an ion charge effect. Owing to the motion of the radicals and ions of plasma in the vacuum, the number of radicals and ions of the plasma that reach the bottom of the hole decreases as the depth of the hole increases and the etch rate decreases as a result. Note that the etch rate may also be affected by the type of radicals, the material of the etched film in which the hole is formed, compatibility between the radicals and the film material, and the temperature, for example.

The etch rate is expressed by the following equation (1). In the following, factors affecting the etch rate are described in greater detail based on equation (1).

$$E/R = A \times [E_i \cdot \Gamma_{ion}] \times [\Gamma_{radical}]/([E_i \cdot \Gamma_{ion}] + [\Gamma_{radical}]) \quad (1)$$

In the above equation (1), A represents a value determined by the property and type of material, and $E_i$ represents the ion energy. $\Gamma_{ion}$ represents the number of ions per unit area, and $\Gamma_{radical}$ represents the number of radicals per unit area.

The etch rate is affected by the sputter yield, which represents the number of molecules that leave a substance when an ion collides with the substance. The sputter yield has a correlation with the ion energy. Thus, in equation (1), the ion energy $E_i$ is used instead of the sputter yield to represent the etch rate of ions. On the other hand, the energy of radicals is lower than that of ions, and as such, the etch rate of radicals is not taken into account in equation (1).

Thus, based on the above equation (1), the etch rate may be determined primarily based on the number of ions and the number of radicals per unit area and the ion energy. Accordingly, in the embodiments described below, the material of the etched film is altered in the depth direction in which the etch rate decreases. In this way, a decrease in the number of radicals and ions that reach the bottom of the hole as the hole becomes deeper may be prevented, and as a result, a decrease in the etch rate may be suppressed.

[Film Structure]

In the following, an exemplary layer structure of a film that may be used in an embodiment of the present invention is described with reference to FIG. 4. In the present example, a first silicon oxide film 12 and a second silicon oxide film 14 are stacked in this order on a silicon wafer 10 made of silicon (Si), and a mask 16 is formed on the second silicon oxide film 14. The mask 16 is a polysilicon mask having a predetermined pattern formed thereon according to a desired etch shape. In the present embodiment, the silicon oxide film is arranged into a two-layer structure including the first silicon oxide film 12 and the second silicon oxide film 14. However, the present invention is not limited to such an embodiment, and the silicon oxide film may alternatively have three or more layers, for example. Also, the silicon oxide film may be made of one single layer having a silicon content per unit volume and/or a volume density that varies in the depth direction, for example.

In the present embodiment, the second silicon oxide film 14 is made of a dense $SiO_2$ film (hard $SiO_2$), and the first silicon oxide film 12 is made of a relatively coarser $SiO_2$ film (soft $SiO_2$) compared to the second silicon oxide film 14. In this way, the silicon content per unit volume and the volume density of the second silicon oxide film 14 corresponding to the upper layer is arranged to be relatively higher than the silicon content per unit volume and the volume density of the first silicon oxide film 12 corresponding to the lower layer.

The second silicon oxide film 14 may be made of a TEOS (tetraethyl orthosilicate) film or a USG (undoped silicate glass) film, for example. As is described in detail below, the second silicon oxide film 14 may be formed using various film forming methods. For example, the TEOS film may be formed by plasma CVD (chemical vapor deposition) using a TEOS gas, and the USG film may be formed by plasma CVD using a TEOS gas and an oxygen gas. The first silicon oxide film 12 may be a BPSG (boron phosphate silicate glass) film, which is a silicon oxide film doped with B (boron) and P (phosphorus), for example. In this case, because the second silicon oxide film 14 corresponding to the upper layer is not doped with B (boron) and P (phosphorus), the second silicon oxide film 14 may be arranged to have a relatively higher silicon content per unit volume compared to the first silicon oxide film 12.

Also, the first silicon oxide film 12 may be a fluorine-doped silicon oxide (SiOF) film, for example. In this case, because the second silicon oxide film 14 corresponding to the upper layer does not contain fluorine, the second silicon oxide film 14 may be arranged to have a relatively higher silicon content per unit volume compared to the first silicon oxide film 12 corresponding to the lower layer. Also, in this case, the first silicon oxide film 12 corresponding to the lower layer may be arranged to have a relatively higher fluorine content per unit volume compared to the second silicon oxide film 14 corresponding to the upper layer.

Also, the first silicon oxide film 12 may be formed using the SOG (spin-on-glass) coating technique, for example. Also, the first silicon oxide film 12 may be a FSG (fluorosilicate glass) film as described in detail below.

Figure 4:
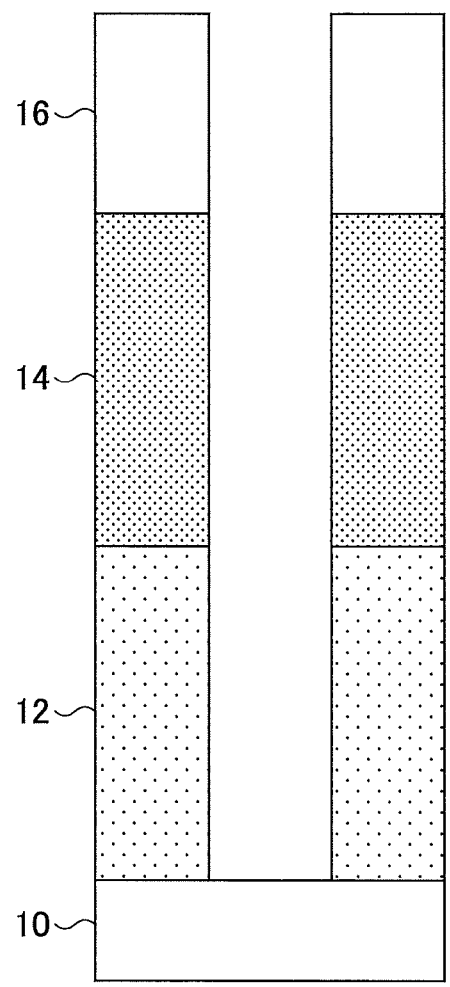
FIG. 4 illustrates a structure of a film according to an embodiment of the present invention.

As illustrated in FIG. 4, in the present embodiment, a plasma is generated from an etching gas containing a fluorocarbon (CF) based gas, and a predetermined pattern is etched in the first silicon oxide film 12 and the second silicon oxide film 14 by the generated plasma using polysilicon that is arranged on the second silicon oxide film 14 as the mask 16.

As can be appreciated from the following chemical formula (2), during etching, the silicon oxide film and fluorocarbons react with each other to generate silicon fluoride and carbon dioxide. Carbon dioxide and silicon tetrafluoride are gases that are discharged to the exterior. In this way, the silicon oxide film is etched.

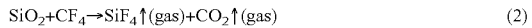

$$SiO_2 + CF_4 \rightarrow SiF_4\uparrow(gas) + CO_2\uparrow(gas) \quad (2)$$

Figure 5:
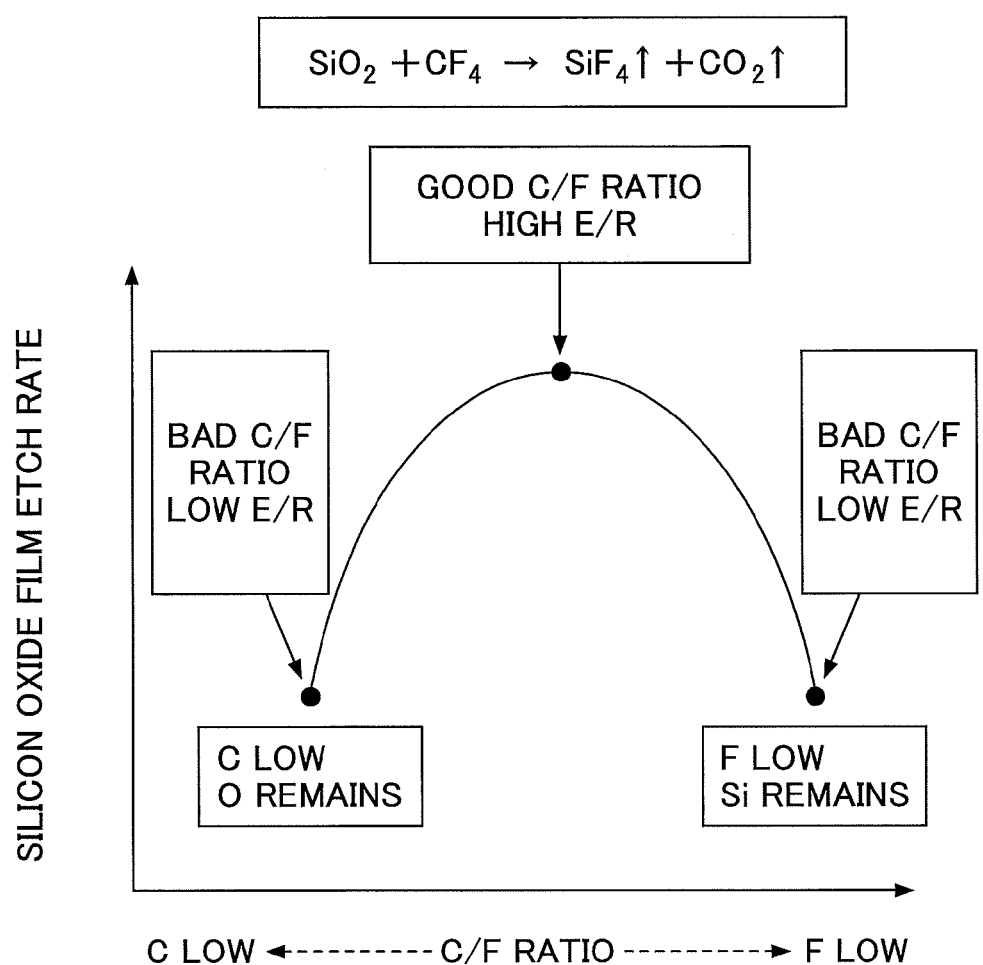
FIG. 5 illustrates a relationship between the etch rate and the C/F ratio upon etching a silicon oxide film with a fluorocarbon based gas according to an embodiment of the present invention.

In the following, the relationship between the ratio of carbon (C) to fluorine (F) contained in plasma and the etch rate E/R of the silicon oxide film are described with reference to FIG. 5. At the center portion of the graph of FIG. 5 where the ratio of carbon (C) to fluorine (F) within the plasma has a good balance, silicon (Si) and oxygen (O) within the silicon oxide film are encouraged to react with the plasma to prompt the above reaction $SiF_4\uparrow + CO_2\uparrow$, and because the above reaction is encouraged, the etch rate E/R of the silicon oxide film increases. On the other hand, at the left side portion of the graph of FIG. 5 where the content of carbon (C) is lower than the content of fluorine (F) within the plasma, the generation of $CO_2\uparrow$ (see FIG. 6) of the above reaction $SiF_4\uparrow + CO_2\uparrow$ is not adequately encouraged due to the shortage of carbon (C). As a result, etching the silicon oxide film becomes more difficult and the etch rate E/R of the silicon oxide film decreases. Similarly, at the right side portion of the graph of FIG. 5 where the content of fluorine (F) within the plasma is lower than the content of carbon (C), the generation of $SiF_4\uparrow$ (see FIG. 6) of the above reaction $SiF_4\uparrow + CO_2\uparrow$ is not adequately encouraged. As a result, etching of the silicon oxide film becomes more difficult and the etch rate E/R of the silicon oxide film decreases. As can be appreciated, the etch rate E/R of the silicon oxide film is affected by the composition elements of the plasma, and for example, the etch rate E/R decreases when the amount of fluorine radicals within the plasma decreases.

Figure 6:
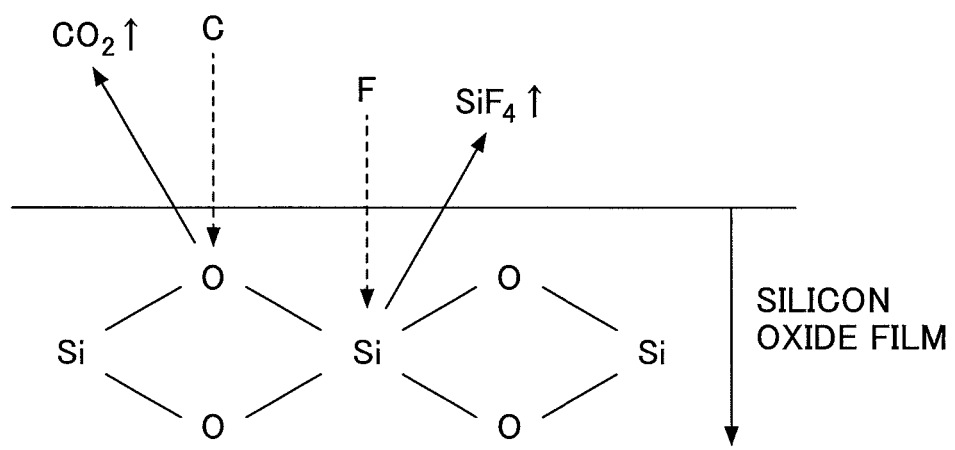
FIG. 6 illustrates a state of the silicon oxide film upon being etched using a fluorocarbon based gas according to an embodiment of the present invention.

Referring to FIG. 6, it can be appreciated that the silicon oxide film can be etched with a smaller amount of fluorine radicals as the content of silicon within the silicon oxide film becomes lower. As described above, the amount of fluorine radicals that reach the bottom of a hole decreases as the hole being etched in the silicon oxide film becomes deeper. Thus, as the amount of fluorine radicals that reach the bottom of the hole decreases, the etch rate decreases. In the present embodiment, the composition of the silicon oxide film is varied in the depth direction. That is, in the present embodiment, as a hole is etched deeper, the silicon content and/or volume density of the silicon oxide film at the bottom of the hole is arranged to decrease. Accordingly, by implementing the silicon oxide film structure of the present embodiment, even when the amount of fluorine radicals that reach the bottom of the hole decreases as the hole etched in the silicon oxide film becomes deeper, a decrease in the etch rate may be suppressed, and an etch stop may be avoided.

In the silicon oxide film used in the present embodiment, the silicon content and/or volume density of the second silicon oxide film 14 corresponding to the upper layer is arranged to be relatively higher than the silicon content and/or volume density of the first silicon oxide film 12 corresponding to the lower layer. In this way, even when a deep hole is formed in the first silicon oxide film 12 corresponding to the lower layer, because the first silicon oxide film 12 is a coarser silicon oxide film compared to the second silicon oxide film 14 corresponding to the upper layer, a decrease in the etch rate may be suppressed.

In the following, an exemplary film forming method is described that may be used in the present embodiment for forming the silicon oxide film having the upper layer second silicon oxide film 14 made of a dense film and the lower layer first silicon oxide film 12 made of a relatively coarser film. In this case, the silicon content and volume density of the dense film is higher than the silicon content and volume density of the relatively coarser film. To form such a silicon oxide film, a SOG (spin-on-glass) film may be formed on the silicon wafer 10 as the first silicon oxide film 12 using the SOG (spin-on-glass) coating technique. Then, a USG film may be formed as the second silicon oxide film 14 using a plasma CVD method. Then, a polysilicon layer may be deposited in a similar manner using a CVD method to form a patterned photoresist, and the polysilicon mask 16 may be formed by dry etching. Then, the photoresist may be removed by dry etching using an O₂ plasma, for example.

[Modification 1]

As another exemplary method for forming the silicon oxide film with the upper layer second silicon oxide film 14 having a lower silicon content than the silicon content of the lower layer first silicon oxide film 12, the first silicon oxide film 12 may be doped with impurities such as boron (B) and/or phosphorus (P) while being formed. In this way, the first silicon oxide film 12 having the impurities doped therein may have a lower silicon content compared to that of the second silicon oxide film 14 that does not have any impurities doped therein. Accordingly, the silicon content of the lower layer first silicon oxide film 12 may be arranged to be lower than the upper layer second silicon oxide film 14, and as a result, even when a fewer number of fluorine radicals reach the bottom of a deep hole formed in the lower layer first silicon oxide film 12, a decrease in the etch rate may be suppressed.

An exemplary method of forming the lower layer silicon oxide film having impurities doped therein may involve forming a silicade glass film such as a BPSG film as the first silicon oxide film 12 on the silicon wafer 10 using a high density plasma CVD method. Then, a TEOS film may be formed as the second silicon oxide film 14 under a low pressure state that is slightly lower than ordinary pressure (a pressure higher than a low vacuum state) using a CVD method. In this case, because impurities are doped in the lower layer first silicon oxide film 12, the silicon content of the lower layer first silicon oxide film 12 may be lower than that of the upper layer second silicon oxide film 14. Then, a polysilicon layer may be deposited using a CVD method to form a patterned photoresist, and the polysilicon mask 16 may be formed by dry etching. Then, the photoresist may be removed by dry etching using an O₂ plasma, for example.

[Modification 2]

As another method of varying the silicon content per unit volume of the silicon oxide film in the depth direction, the fluorine content per unit volume of the silicon oxide film may be varied in the depth direction. That is, in the case where the silicon oxide film has a two-layer structure, the fluorine content of the lower layer first silicon oxide film 12 may be arranged to be higher than the fluorine content of the upper layer second silicon oxide film 14. In this way, by having the lower layer first silicon oxide film 12 have a higher content of fluorine (F) than the upper layer second silicon oxide film 14, even when a fewer number of fluorine F radicals reach the bottom of a deep hole formed in the lower layer first silicon oxide film 12, fluorine (F) may be supplied from the first silicon oxide film 12 such that a decrease in the etch rate may be suppressed. Note that in some embodiments, the silicon oxide film may be formed using a single film forming method and arranged into a multilayer structure having a fluorine content that gradually increases in the depth direction. In this way, the lower layer silicon oxide films may be arranged to have a relatively higher fluorine content than the upper layer silicon oxide films, and as such, the lower layer silicon oxide films may be arranged to have a relatively lower silicon content than the upper layer silicon oxide films.

Further, a silicon oxide film combining the aspects of the above embodiment and Modification 1, a silicon oxide film combining the aspects of the above embodiment and Modification 2, or a silicon oxide film combining the aspects of Modification 1 and Modification 2 may be used, for example. Note that a silicon oxide film having other configurations may also be used.

Note that in the two-layer silicon oxide film described above, the silicon/fluorine content within each layer may be uniform, or the silicon/fluorine content within each layer may be arranged to vary in the depth direction. For example, the upper layer second silicon oxide film 14 may be arranged to have a higher silicon content than the lower layer first silicon oxide film 12, and the lower layer first silicon oxide film 12 may be arranged to have a higher fluorine content than the upper layer second silicon oxide film 14.

Also, the silicon oxide film may have an impurity content that varies in the depth direction. For example, the lower layer first silicon oxide film 12 may be arranged to have a lower impurity content than the upper layer second silicon oxide film 14. Note that the impurity content within each layer may be uniform, or the impurity content within each layer may also be arranged to vary in the depth direction.

[Switching Section of Silicon Oxide Film]

Figure 7:
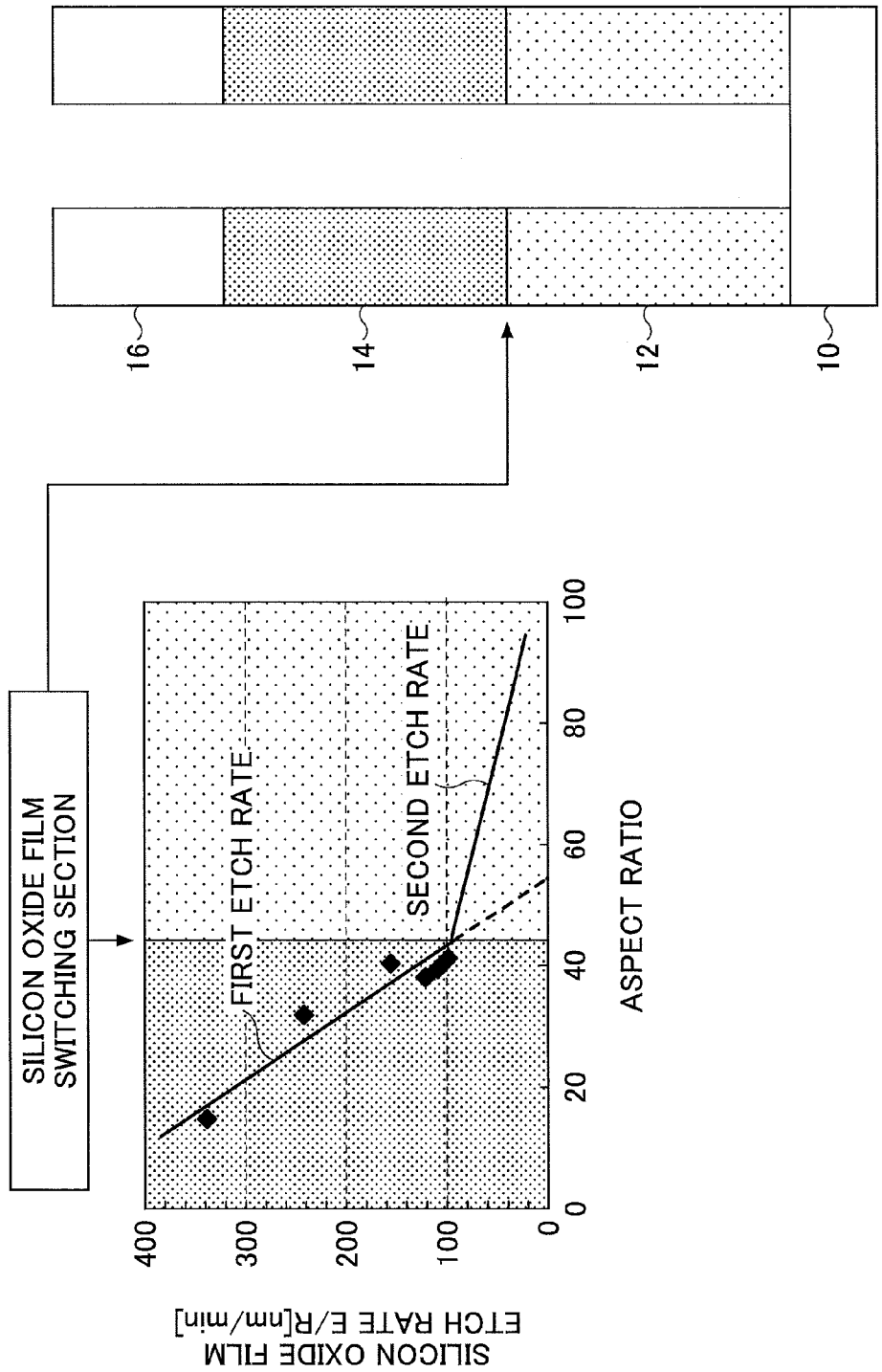
FIG. 7 illustrates a switching section where layers of the silicon oxide film are switched from an upper layer to a lower layer according to an embodiment of the present invention.

In the following, a switching section where the layers of the silicon oxide film are switched between the first silicon oxide film 12 and the second silicon oxide film 14 are described with reference to FIG. 7. FIG. 7 illustrates an example in which an etching gas containing a fluorocarbon (CF) based gas is supplied upon etching the upper layer second silicon oxide film 14, and a fluorine (F) gas is supplied in addition to the etching gas containing a fluorocarbon (CF) based gas upon etching the lower layer first silicon oxide film 12.

In the graph of FIG. 7, the horizontal axis represents the aspect ratio and the vertical axis represents the etch rate of the silicon oxide film. Note that in the graph of FIG. 7, "first etch rate" represents the etch rate upon etching the first silicon oxide film 12 (hard SiO₂), and "second etch rate" represents the etch rate upon etching the second silicon oxide film 14 (coarse silicon oxide film such as a fluorine-containing film or a SOG film).

In order to solve the etch stop problem as described above, measures need to be implemented to prevent the first etch rate from becoming zero. Thus, the silicon oxide film layers are switched from the upper layer second silicon oxide film 14 to the lower layer first silicon oxide film 12 such that when forming a hole using an etching method according to the present embodiment, the etch rate may be switched from the first etch rate to the second etch rate at a point where the aspect ratio of the hole being etched reaches 50 or a value less than 55, which corresponds to the value at which the first etch rate becomes zero. That is, the upper layer second silicon oxide film 14 is arranged at an upper portion of the silicon oxide film extending down to where the aspect ratio is 50, and the lower layer first silicon oxide film 12 is arranged at a lower portion of the silicon oxide film where the aspect ratio is greater than 50.

Note, however, that in consideration of productivity issues, in a preferred embodiment, the switching section for switching from the upper layer second silicon oxide film 14 to the lower layer first silicon oxide film 12 may be arranged to be where the aspect ratio reaches 40 and beyond such that the etch rate may be prevented from falling below 100 nm/min, for example.

[Etching Apparatus]

Figure 8:
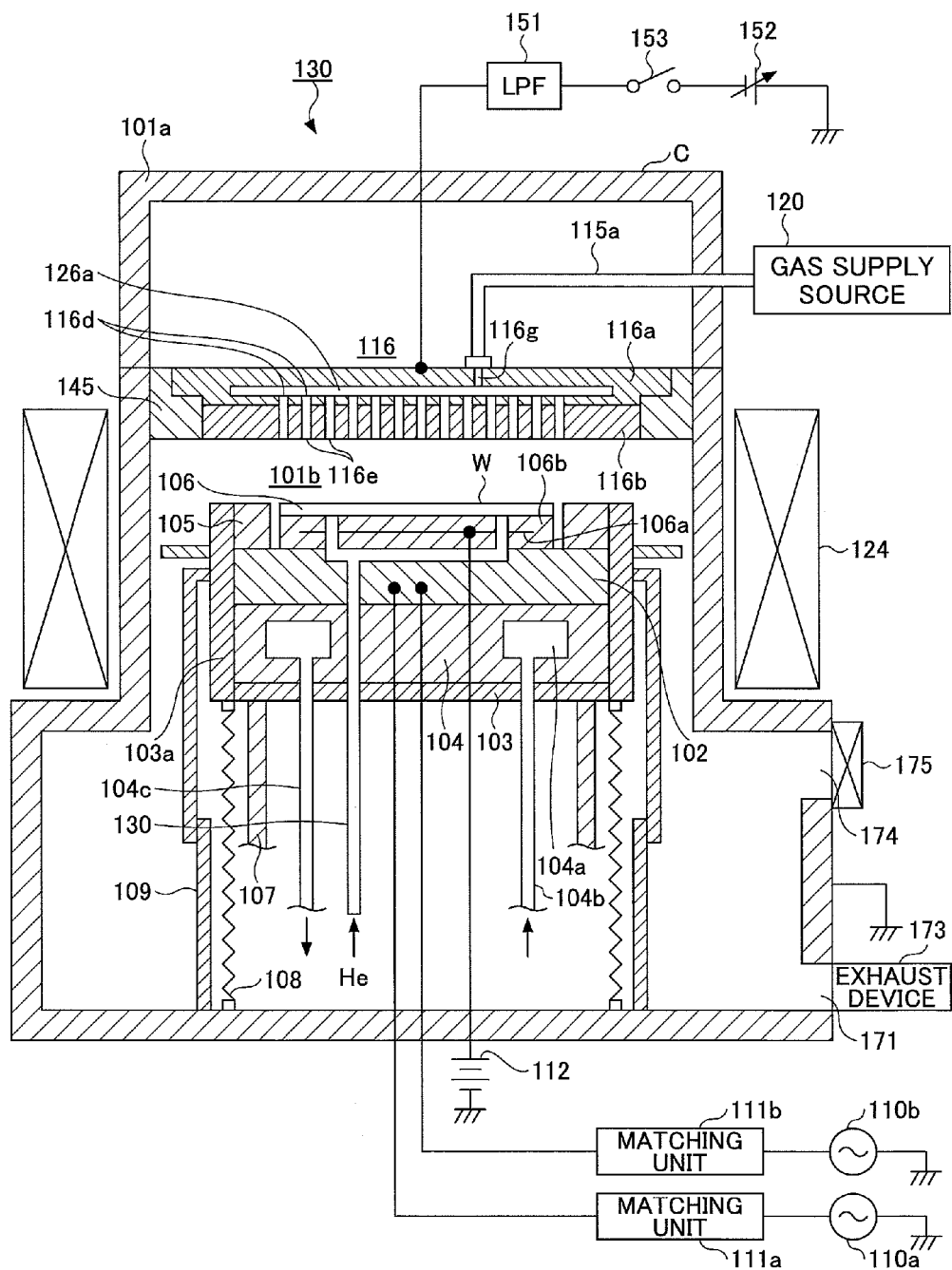
FIG. 8 is a longitudinal cross-sectional view of an etching apparatus according to an embodiment of the present invention.

In the following, an exemplary etching apparatus 130 according to an embodiment of the present invention that may be used to form a hole in the layered film as illustrated in FIG. 4 is described with reference to FIG. 8.

The etching apparatus 130 includes a chamber C (processing chamber) that is maintained airtight and is electrically grounded. The etching apparatus 130 is connected to a gas supply source 120. The gas supply source 120 supplies an etching gas containing a fluorocarbon (CF) based gas as an etching gas. The fluorocarbon gas may contain hexafluoro-1, 3-butadiene ($C_4F_6$) gas, for example.

The chamber C is cylindrical and may be made of aluminum having an alumite-treated (anodized) surface, for example. A mounting table 102 for supporting a silicon wafer W is arranged inside the chamber C. The mounting table 102 also functions as a lower electrode. The mounting table 102 is supported by a conductive support 104 and is arranged to be movable up and down by an elevating mechanism 107 via an insulating plate 103. The elevating mechanism 107 is arranged in the chamber C and is covered by a bellows 108 made of stainless steel. A bellows cover 109 is arranged around the outer side of the bellows 108. A focus ring 105, which may be made of monocrystalline silicon, for example, is arranged at an upper side outer periphery portion of the mounting table 102. Further, a cylindrical inner wall member 103a, which may be made of quartz, for example, is arranged around the mounting table 102 and the support 104.

A first high frequency power supply 110a is connected to the mounting table 102 via a first matching unit 111a, and the first high frequency power supply 110a is configured to supply a high frequency power of a predetermined frequency (e.g. 40 MHz) for plasma generation. Also, a second high frequency power supply 110b is connected to the mounting table 102 via a matching unit 111b, and the second high frequency power supply 110b is configured to supply a high frequency power of a predetermined frequency (e.g. 3.2 MHz) for biasing. Also, a shower head 116 is arranged above the mounting table 102 facing opposite and parallel to the mounting table 102 such that the shower head 116 may function as an upper electrode. In this way, the shower head 116 and the mounting table 102 may function as a pair of electrodes.

An electrostatic chuck 106 for electrostatically attracting a silicon wafer W is arranged on an upper surface of the mounting table 102. The electrostatic chuck 106 includes an electrode 106a arranged within an insulator 106b. A DC voltage source 112 is connected to the electrode 106a, and when a DC voltage from the DC voltage source 112 is applied to the electrode 106a, the silicon wafer W is attracted to the electrostatic chuck 106 by a Coulomb force.

A coolant path 104a is formed within the support 104. A coolant inlet pipe 104b and a coolant outlet pipe 104c are connected to the coolant path 104a. By circulating a suitable coolant such as cooling water within the coolant path 104a, the silicon wafer W may be controlled to a predetermined temperature. Also, a pipe 130 for supplying heat transfer gas (backside gas) such as helium (He) gas is arranged at the back side of the silicon wafer W.

The shower head 116 is arranged at a ceiling portion of the chamber C. The shower head 116 includes a main body 116a and an upper plate 116b forming an electrode plate. The shower head 116 is supported at a top portion of the chamber C via an insulating member 145. The main body 116a is made of a conductive material such as aluminum having an alumite-treated (anodized) surface, for example, and is configured to detachably support the upper plate 116b thereunder.

A diffusion chamber 126a for diffusing gas is arranged within the main body 116a, and a plurality of gas passage holes 116d are formed at the bottom of the main body 116a at positions below the diffusion chamber 126a. A plurality of gas introducing holes 116e penetrating through the upper plate 116b in its thickness direction and communicating with the gas passage holes 116d are arranged at the upper plate 116b. In this way, gas that is supplied to the diffusion chamber 126a may be showered into a plasma processing space within the chamber C via the gas passage holes 116d and the gas introducing holes 116e. Note that a pipe (not shown) for circulating a coolant may be arranged within the main body 116a, for example, in order to cool and adjust the shower head 116 to a desired temperature.

A gas inlet 116g for introducing gas into the diffusion chamber 126a is formed at the main body 116a. The gas supply source 120 is connected to the gas inlet 116g.

A variable DC voltage source 152 is electrically connected to the shower head 116 via a low-pass filter (LPF) 151. Power supply operations of the variable DC voltage source 152 may be turned on/off by an on/off switch 153. The on/off switch 153 may be turned on as is necessary when high frequencies from the first high frequency power supply 110a and the second high frequency power supply 110b are to be applied to the mounting table 102 and plasma is to be generated within the plasma processing space of the chamber C, for example. In this way, a predetermined DC voltage may be applied to the shower head 116.

A cylindrical grounding conductor 101a is arranged to extend above the height of the shower head 116 from a side wall of the chamber C. The cylindrical grounding conductor 101a has a top plate arranged thereon. An exhaust port 171 is arranged at the bottom of the chamber C. An exhaust device 173 is connected to the exhaust port 171. The exhaust device 173 includes a vacuum pump, and the pressure within the chamber C may be reduced to a predetermined vacuum level by operating the vacuum pump. Also, a gate valve 175 is arranged at the side wall of the chamber C for opening/closing a transfer port 174 to enable loading/unloading of the silicon wafer W into/out of the chamber C via the transfer port 174.

A dipole ring magnet 124 is arranged to extend annularly or concentrically around the chamber C and vertically across the position of the mounting table 102 during processing.

With such a configuration, a RF electric field in the vertical direction may be formed by the first high frequency power supply 110a and a horizontal magnetic field may be formed by the dipole ring magnet 124 within a space between the mounting table 102 and the shower head 116. By prompting magnetron discharge using the above orthogonal electromagnetic fields, a plasma may be generated at a high density around the surface of the mounting table 102.

For example, the two-layer silicon oxide film formed in the above-described manner may be subject to parallel plate plasma etching in a lower side dual frequency parallel plate etching apparatus (e.g. FIG. 8) under the following process conditions. For example, the pressure within the processing chamber (chamber C) may be set to 2.66 Pa, high frequency powers with frequencies of 40 MHz/3.2 MHz and power densities of 1.18/4.42 (W/cm$^2$) may be applied to the lower electrode, plasma of a processing gas of $C_4F_6/C_4F_8/Ar/O_2$ may be generated, and the silicon oxide film may be etched using polysilicon as a mask. In this case, the etch depth may be relatively deep, but as described in connection with FIG. 7, the etch depth may reach the first silicon oxide film 12 (e.g. SOG film) having a relatively lower silicon content compared to the second silicon oxide film 14 (e.g. USG film) at a point before the aspect ratio reaches a value at which the etch rate decreases to zero to cause an etch stop. In this way, a decrease in the etch rate may be suppressed, and a contact hole with a relatively high aspect ratio of 60 or greater may be formed, for example.

[Film Forming Apparatus]

In the following, exemplary film forming apparatuses are described that may be used to form the layered silicon oxide film including the first silicon oxide film 12 and the second silicon oxide film 14 as illustrated in FIG. 4.

EXAMPLE 1

Figure 9:
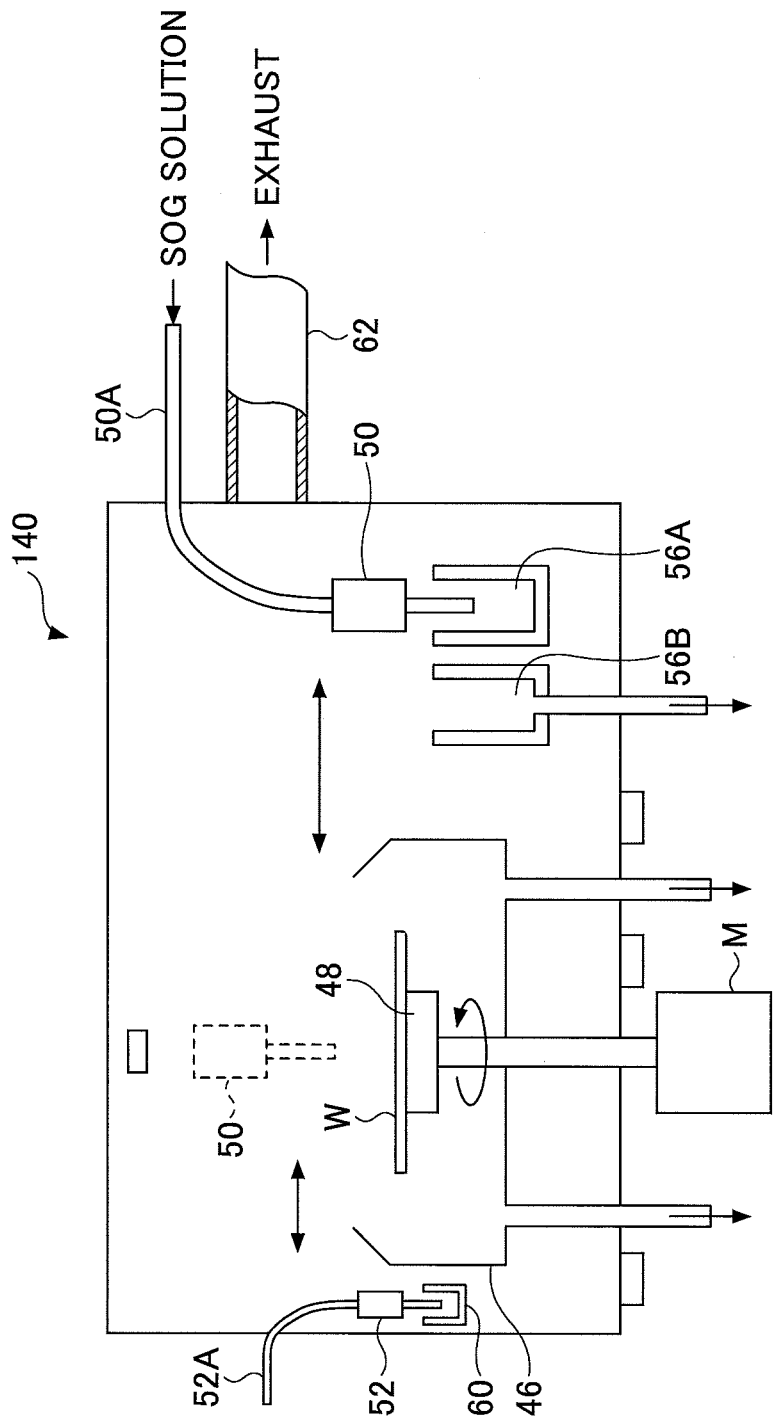
FIG. 9 is a lateral cross-sectional view of a film forming apparatus according to an embodiment of the present invention.
Figure 10:
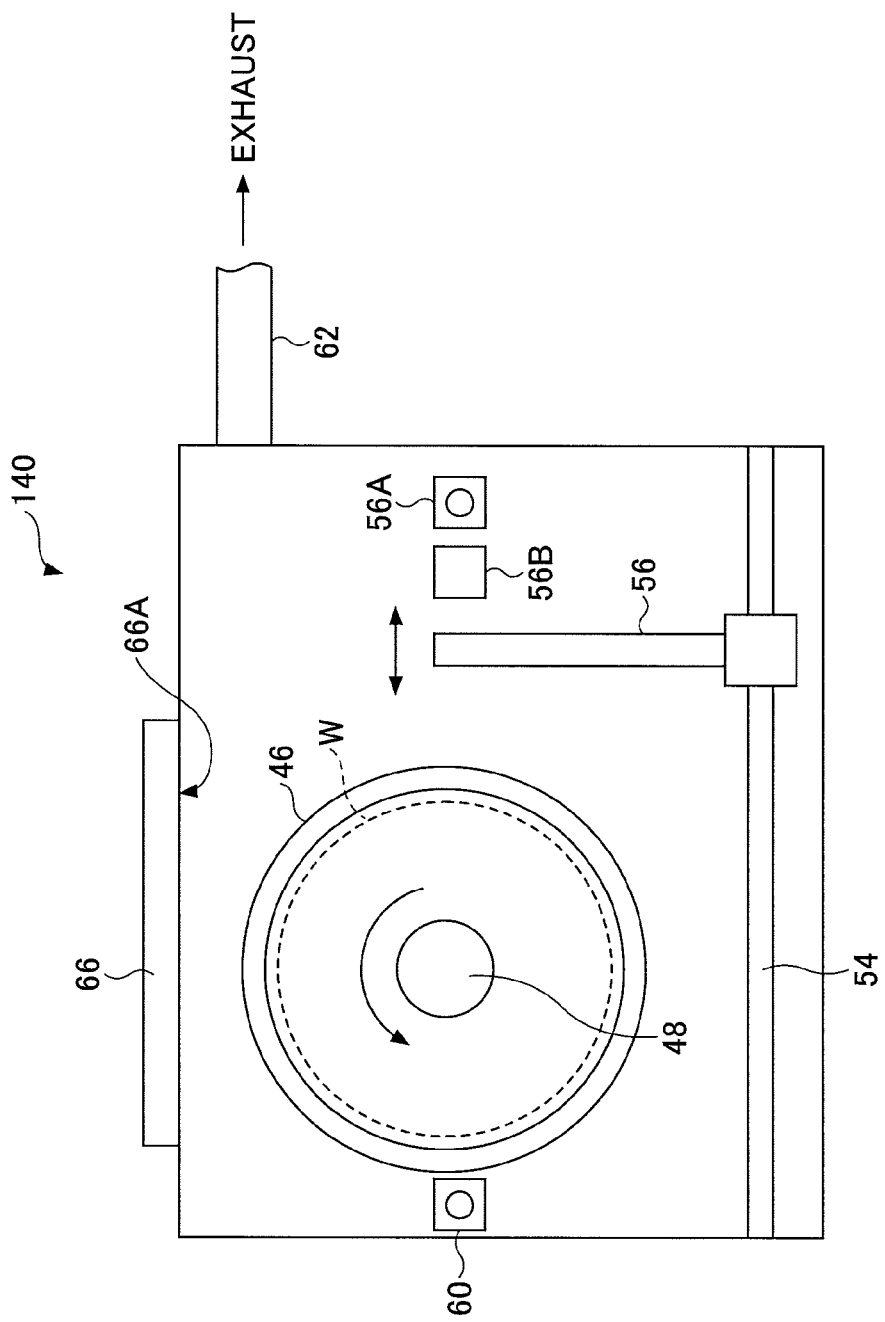
FIG. 10 is a plan view of the film forming apparatus of FIG. 9.

In Example 1, a SOG film is formed as the first silicon oxide film 12, and a USG film is formed as the second silicon oxide film 14 by plasma CVD. FIG. 9 is a longitudinal cross-sectional view of a film forming apparatus 140 used to form the SOG film of Example 1. FIG. 10 is a plan view of the film forming apparatus of FIG. 9.

The film forming apparatus 140 that is used to form the SOG film as the first silicon oxide film 12 is configured to apply a SOG coating solution on the surface of the wafer W using a spin coating technique. As illustrated in FIGS. 9 and 10, the film forming apparatus 140 includes a spin chuck 48 that is rotated by a motor M within a cup 46, a process liquid supply nozzle 50 arranged at a tip portion of a process liquid supply pipe 50A, a rinsing liquid supply nozzle 52 arranged at a tip portion of a rinsing liquid supply pipe 52A, a movable arm 56 that is configured to hold the nozzles 50 and 52 and scan a wafer W across its radial directions while moving along a guide rod 54, a process liquid nozzle waiting unit 56A and a dummy dispense unit 56B at which the process liquid supply nozzle 50 is placed while waiting, a rinsing liquid nozzle waiting unit 60 at which the rinsing liquid supply nozzle 52 is placed while waiting, and an exhaust pipe 62.

In the following, a coating process that is performed at the film forming apparatus 140 is described. When the wafer W that is mounted on the spin chuck 48 is rotated along with the spin chuck 48, the process liquid supply nozzle 50 is held by the movable arm 56 and is moved above the wafer W such that droplets of SOG solution corresponding to a processing liquid may be dropped on the wafer W. The SOG solution may be a mixture of the film material such as a silanol compound and a solvent such as ethyl alcohol, for example. At this point, the wafer W is being rotated at a relatively high speed (2000-6000 rpm), and as a result, the SOG solution is diffused from a center portion to a periphery portion of the wafer W by a centrifugal force to form the SOG film on the wafer W. After the SOG film is formed, the rinsing liquid supply nozzle 52 is moved above the wafer W, and the SOG film formed on the peripheral portion of the wafer W is dissolved and removed by the rinsing liquid, which may be an ethyl alcohol solution, for example. Then, after the solvent is evaporated by a heating process at a temperature of 100-140° C. in a pre-heating step, the wafer W is loaded into a heating apparatus (not shown), and a heating process is performed on the wafer W at a temperature of about 400-450° C. such that siloxane bonding occurs within the SOG film. In this way, the SOG film corresponding to a silicon oxide film is formed. Note that in the case of forming the SOG film to have a predetermined film thickness, the process steps of applying the SOG solution on the wafer W and evaporating the solvent may be repeated multiple times after which the wafer W may be loaded into the heating apparatus to perform the heating process, for example.

The two-layer silicon oxide film formed in the above-described manner may be subject to parallel plate plasma etching in a lower side dual frequency parallel plate etching apparatus (e.g. FIG. 8) under the following process conditions. For example, the pressure may be set to 2.66 Pa, high frequency powers with frequencies of 40 MHz and 3.2 MHz may be applied at power densities of 1.18 (W/cm$^2$) and 4.42 (W/cm$^2$), respectively, and the silicon oxide film may be etched by a processing gas of $C_4F_6/C_4F_8/Ar/O_2$ using polysilicon as a mask. In this case, when the etch depth reaches a certain depth, the silicon oxide film layer is switched to the first silicon oxide film 12 (e.g. SOG film) having a relatively lower silicon content compared to the second silicon oxide film 14 (e.g. USG film). In this way, a decrease in the etch rate may be suppressed, and a contact hole with a relatively high aspect ratio of 60 or greater may be formed, for example.

EXAMPLE 2

Figure 11:
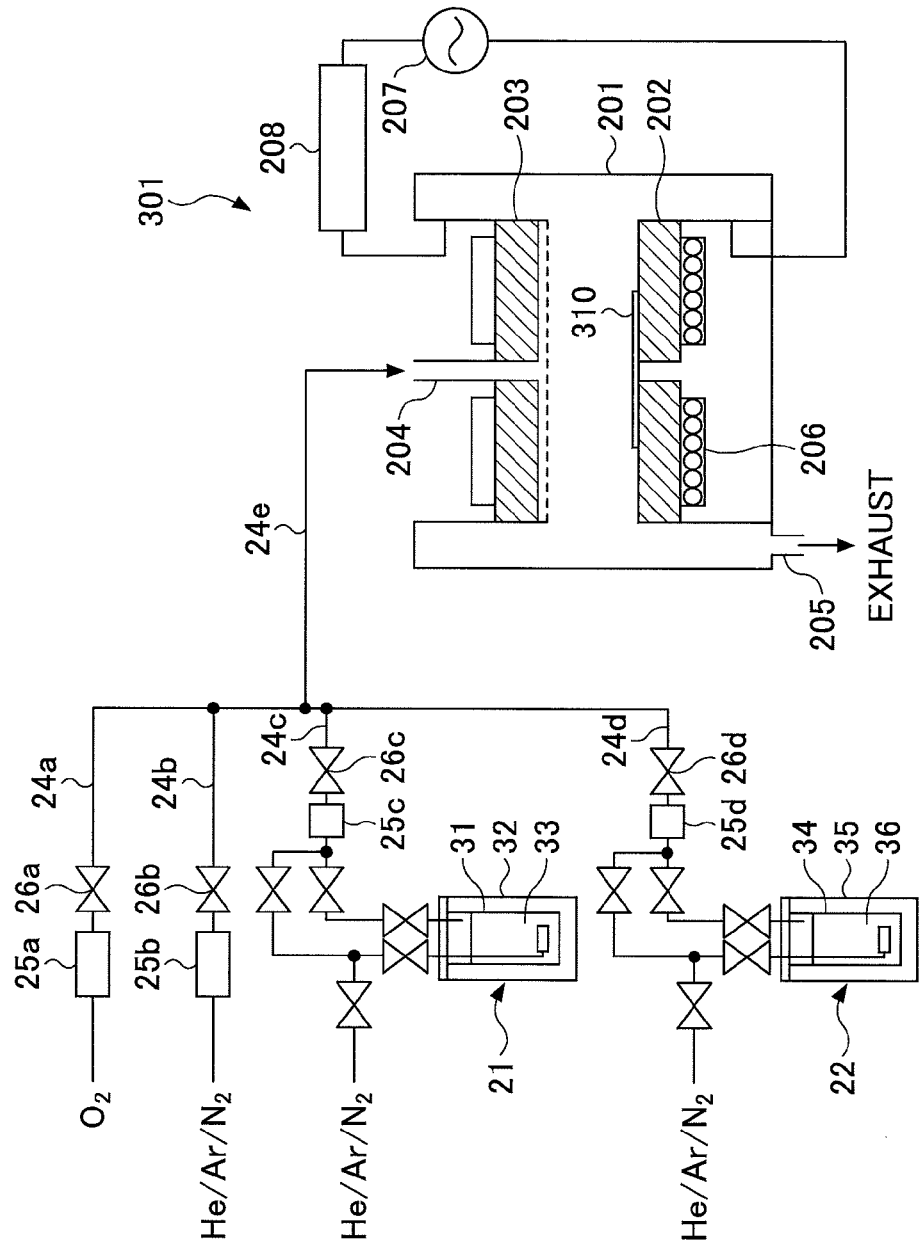
FIG. 11 is a lateral cross-sectional view of a film deposition apparatus according to an embodiment of the present invention.

In Example 2, a silicade glass film such as a BPSG film is formed as the first silicon oxide film 12 using a high density plasma CVD method, and a TEOS film is formed as the second silicon oxide film 14 under a low pressure state that is slightly lower than ordinary pressure (a pressure higher than a low vacuum state) using a CVD method. FIG. 11 is a longitudinal cross-sectional view of a film deposition apparatus 301 that may be used to form the BPSG film of Example 2.

As illustrated in FIG. 11, the film deposition apparatus 301 that is used to form the BPSG film as the first silicon oxide film 12 includes an upper electrode 203 and a lower electrode 202 of a parallel plate system arranged within a chamber 201. The film deposition apparatus 301 also includes an RF power supply 207 for supplying an RF power at a frequency of 13.56 MHz between the upper electrode 203 and the lower electrode 202 to convert a film forming gas into plasma. The pressure within the chamber 201 is reduced to a suitable pressure by an exhaust device that is connected to an exhaust port 205. The lower electrode 202 also functions as a mounting table on which a silicon wafer 310 may be mounted, and a heating unit 206 for heating the silicon wafer 310 is arranged at the lower electrode 202.

Further, the film deposition apparatus 301 includes a supply source 21 for supplying phosphorus acid dimethoxy trimethylsilylester (hereinafter referred to as SOP-11(b)) as a phosphorus-containing compound source 33, a supply source 22 for supplying $SiH_4$ as a silicon-containing compound source 36, a supply source for supplying oxygen ($O_2$) gas as an oxidative gas source, and a supply source for supplying Ar or $N_2$ as a rare gas source. These supply sources are connected to a gas introducing port 204 of the chamber 201 via a pipe 24e.

The RF power supply 207 is connected to the upper electrode 203 via a matching circuit 208. Also, in FIG. 11, pipes 24a-24d for guiding gases are respectively connected to flow meters 25a-25d. Also, valves 26a-26d are arranged at the pipes 24a-24d for opening/closing the flow paths for the source gases formed in the pipes 24a-24d. Further, adjusting units 32 and 35, which may be a heater or a cooler, for example, may be provided for controlling the temperature of the sources 33 and 36.

In the present example, first, the silicon wafer 310 is introduced into the chamber 201 of the film deposition apparatus 301. Then, the silicon wafer 310 is heated and the temperature of the silicon wafer 310 is maintained within a predetermined temperature range according to film forming conditions. Note that a base insulating film made of a silicon oxide film, for example, may be formed on the silicon wafer 310.

Then, a film forming gas that is adjusted to be within a range prescribed by the film forming conditions is introduced into the chamber 201, and the film forming gas is converted into plasma by an RF power prescribed by the film forming conditions.

By maintaining the above state for a predetermined time period, a PSG film having a high concentration of phosphorus (phosphorus-containing insulating film) may be formed at a predetermined film thickness. Note that the PSG film may be fluidized at around the temperature prescribed by the film forming conditions, and in this case, planarization may be achieved along with the film formation.

Otherwise, a heating process may be separately performed for planarization after forming the PSG film (phosphorus-containing insulating film) on the silicon wafer 310 so that the PSG film may be fluidized and flattened. In this way, a PSG film having a flattened surface may be formed.

According to the present example, $SiH_4$ is used as a silicon-containing compound, SOP-11(b) is used as a phosphorus-containing compound, and a suitable amount of oxidative gas such as oxygen ($O_2$) gas is added. In this way, the fluidization temperature for enabling planarization may be substantially reduced.

In the following, a method of forming a BPSG film containing phosphorus using a plasma excitation method is described as an exemplary device fabrication method implemented by the film deposition apparatus 301.

In the present example, a gas mixture containing $SiH_4$, SOP-11(b), TMB or TEM, and $N_2O$ is used as the film forming gas, and the BPSG film is formed under the following film forming conditions.

| | |
|---|---|
| Temperature | 150-400° C. |
| Gas Pressure | 0.5-3.0 Torr (66.66-399.9 Pa) |
| Flow Rate of SOP-11(b) Bubbling Gas ($N_2$ or Ar) | 300-1500 sccm |
| SOP-11(b) Source Temperature | 45° C. |
| Flow Rate of $SiH_4$ | 100-2000 sccm |
| Flow Rate of TMP | 15-600 sccm |
| Flow Rate of TMB or TEB | 10-300 sccm |
| Flow Rate of Oxidative Gas ($O_2$) | 300 sccm or less |
| RF Power | 0.147-1.18 W/cm² |
| Frequency | 100 kHz-2.5 GHz |

By implementing the above film forming conditions, a BPSG film (phosphorus-containing insulating film) made of a mixture of $SiO_2$, phosphorus (P), and boron (B) may be formed on the silicon wafer 310.

The two-layer silicon oxide film formed in the above-described manner may be subject to parallel plate plasma etching in a lower side dual frequency parallel plate etching apparatus (e.g. FIG. 8) under the following process conditions. For example, the pressure may be set to 2.66 Pa, high frequency powers with frequencies of 40 MHz and 3.2 MHz may be applied at power densities of 1.18 (W/cm²) and 4.42 (W/cm²), respectively, and the silicon oxide film may be etched by a processing gas of $C_4F_6/C_4F_6/Ar/O_2$ using polysilicon as a mask. In this case, when the etch depth reaches a certain depth, the silicon oxide film layer is switched to the first silicon oxide film 12 (e.g. BPSG film) having a relatively lower silicon content compared to the second silicon oxide film 14 (e.g. TEOS film). In this way, a decrease in the etch rate may be suppressed, and a contact hole with a relatively high aspect ratio of 60 or greater may be formed, for example.

Note that in the above Example 1, the first silicon oxide film 12 is made of a SOG film, and the second silicon oxide film 14 is made of a USG film. In the above Example 2, the first silicon oxide film 12 is made of a BPSG film, and the second silicon oxide film 14 is made of a TEOS film. However, the combination of the first silicon oxide film 12 and the second silicon oxide film 14 may be altered in other examples. The TEOS film may be formed by plasma CVD using TEOS gas, and the USG film may be formed by plasma CVD using TEOS gas and oxygen gas.

EXAMPLE 3

In Example 3, the first silicon oxide film 12 varies from that of Example 2. Specifically, in the present example, a FSG film is formed as the first silicon oxide film 12 under the following process conditions using the above-described film deposition apparatus 301 (FIG. 11). The FSG film forming conditions are as follows.

| | |
|---|---|
| Temperature | 150-400° C. |
| Gas Pressure | 533.288 × 10⁻³ Pa |
| Flow Rate of $SiF_4$ Gas | 26 sccm |
| Flow Rate of $SiH_4$ Gas | 38 sccm |
| Flow Rate of $O_2$ Gas | 111 sccm |
| Flow Rate of Ar Gas | 60 sccm |
| RF Power | 2.16 W/cm² |

By implementing the above film forming conditions, a FSG film may be formed on the silicon wafer 310. Note that in some embodiments, the gas ratio of the $SiF_4$ gas to the $SiH_4$ gas may be arranged to vary in order to vary the fluorine content of the FSG film. That is, the flow rate of the $SiF_4$ gas may be increased with respect to that of the $SiH_4$ gas such that the fluorine content of the FSG film may increase in the depth direction.

In another example, a SiOF film may be formed as the first silicon oxide film 12 under the following process conditions using an inductively coupled plasma (ICP) apparatus.

| Growth Furnace Pressure | $533.288 \times 10^{-3}$ Pa (4 mTorr) |
|---|---|
| Flow Rate of Silicon Fluoride ($SiF_4$) Gas to be Introduced | 20-26 sccm |
| Flow Rate of $SiH_4$ Gas to be Introduced | 38 sccm |
| Flow Rate of $O_2$ Gas to be Introduced | 111 sccm |
| Flow Rate of Ar Gas to be Introduced | 60 sccm |
| High Frequency (ICP) Power | 3.93 W/cm$^2$ |
| Bias Power | 2.16 W/cm$^2$ |

By forming a fluorine-containing film as the first silicon oxide film 12, when the etch depth reaches a certain depth in the two-layer silicon oxide film, for example, the silicon oxide film layer may be switched to the first silicon oxide film 12 (FSG film) having a higher fluorine content than the second silicon oxide film 14 (e.g. USG film or TEOS film). In this way, when a deep hole is etched in the silicon oxide film, fluorine radicals may be more easily supplied to the bottom of the hole such that a decrease in the etch rate may be suppressed and a contact hole having a relatively high aspect ratio of 60 or greater may be formed, for example.

EXAMPLE 4

Instead of arranging the silicon oxide film into two layers including the first silicon oxide film 12 and the second silicon oxide film 14, a multilayer film may be formed by repetitively forming silicon oxide films using the film formation method of Example 3, for example. In this case, the flow rate of the $SiF_4$ gas may initially be set relatively high with respect to the flow rate of the $SiH_4$ gas to form a silicon oxide film having a relatively high fluorine content at deeper portions of the multilayer film, and the flow rate of the $SiF_4$ gas may gradually be decreased with respect to the flow rate of the $SiH_4$ gas.

Although certain illustrative embodiments of the present invention have been described above with reference to the accompanying drawings, the present invention is not limited to these embodiments. It would be apparent to those skilled in the art that numerous variations and modifications may be made within the scope of the present invention in light of the disclosures made herein. It is to be understood that all of such variations and modifications are included within the scope of the present invention.

For example, although the FSG film and the BPSG film are formed by the plasma CVD film deposition apparatus of FIG. 11 in the above described embodiments, these films may also be formed using the film forming apparatus of FIG. 9 that is used to form the SOG film. Also, the SiOF film may be formed using the above film forming apparatus used to form the SOG film or the plasma CVD film deposition apparatus, for example.

Also, the workpiece subject to processing according to the present invention is not limited to the silicon wafer described above. For example, a large substrate for a flat panel display, or a substrate for an EL (electroluminescence) element or a solar cell may also be used as the workpiece.

DESCRIPTION OF THE REFERENCE NUMERALS 10 silicon wafer
12 first silicon oxide film
14 second silicon oxide film
16 mask
130 etching apparatus
140 film forming apparatus
201 chamber
301 film deposition apparatus

The invention claimed is:

1. An etching method comprising the steps of:
  supplying an etching gas containing a fluorocarbon (CF) based gas into a processing chamber and generating a plasma from the etching gas; and
  etching a silicon oxide film through a polysilicon mask using the plasma, the polysilicon film having a predetermined pattern and being arranged on the silicon oxide film, and the silicon oxide film having a fluorine content per unit volume that varies in a depth direction,
  wherein the silicon oxide film includes a multi-layer film that has the fluorine content per unit volume that increases in the depth direction, and the multi-layer film is formed by a gas including a silicon fluoride gas.

2. The etching method as claimed in claim 1, wherein at least one of the silicon content and the volume density of the silicon oxide film decreases in the depth direction.

3. The etching method as claimed in claim 1, wherein
  the silicon oxide film includes an upper layer silicon oxide film and a lower layer silicon oxide film; and
  at least one of the silicon content per unit volume and the volume density of the upper layer silicon oxide film is higher than at least one of the silicon content per unit volume and the volume density of the lower layer silicon oxide film.

4. The etching method as claimed in claim 1, wherein
  the silicon oxide film includes an upper layer silicon oxide film and a lower layer silicon oxide film; and
  the fluorine content per unit volume of the lower layer silicon oxide film is higher than the fluorine content per unit volume of the upper layer silicon oxide film.

5. The etching method as claimed in claim 1, wherein the silicon oxide film has an impurity content that varies.

6. The etching method as claimed in claim 3, wherein the silicon oxide film is configured to have the upper layer silicon oxide film switched to the lower layer silicon oxide film at a point where an aspect ratio of a hole etched by the etching method is less than or equal to 50, the aspect ratio representing a ratio of a depth of the hole with respect to a diameter of an opening of the hole.

7. The etching method as claimed in claim 6, wherein the silicon oxide film is configured to have the upper layer silicon oxide film switched to the lower layer silicon oxide film at a point where an aspect ratio of a hole etched by the etching method is less than or equal to 40, the aspect ratio representing a ratio of a depth of the hole with respect to a diameter of an opening of the hole.

8. The etching method as claimed in claim 1, wherein the fluorocarbon based gas contains hexafluoro-1,3-butadiene ($C_4F_6$) gas.

9. The etching method as claimed in claim 1, wherein the silicon oxide film is formed using at least one of a CVD (chemical vapor deposition) technique and a SOG (spin-on glass) technique.

10. The etching method as claimed in claim 1, wherein the multi-layer film is formed by multiple steps of decreasing a flow rate of the silicon fluoride gas.

* * * * *